United States Patent
Reinhard et al.

(10) Patent No.: US 10,651,324 B2
(45) Date of Patent: May 12, 2020

(54) SELF-ASSEMBLY PATTERNING FOR FABRICATING THIN-FILM DEVICES

(71) Applicant: FLISOM AG, Niederhasli (CH)

(72) Inventors: Patrick Reinhard, Zurich (CH); Adrian Chirila, Herznach (CH)

(73) Assignee: FLISOM AG, Niederhasli (CH)

( * ) Notice: Subject to any disclaimer, the term of this patent is extended or adjusted under 35 U.S.C. 154(b) by 74 days.

(21) Appl. No.: 16/077,036

(22) PCT Filed: Jan. 27, 2017

(86) PCT No.: PCT/EP2017/051854
§ 371 (c)(1),
(2) Date: Aug. 9, 2018

(87) PCT Pub. No.: WO2017/137271
PCT Pub. Date: Aug. 17, 2017

(65) Prior Publication Data
US 2019/0044008 A1 Feb. 7, 2019

(30) Foreign Application Priority Data

Feb. 11, 2016 (WO) .................. PCT/IB2016/050727

(51) Int. Cl.
*H01L 31/18* (2006.01)
*H01L 31/032* (2006.01)
(Continued)

(52) U.S. Cl.
CPC ...... *H01L 31/0322* (2013.01); *B81C 1/00031* (2013.01); *H01L 21/02491* (2013.01);
(Continued)

(58) Field of Classification Search
None
See application file for complete search history.

(56) References Cited

U.S. PATENT DOCUMENTS

| | | | |
|---|---|---|---|
| 4,228,315 A | 10/1980 | Napoli | |
| 4,332,880 A | 6/1982 | Izu et al. | |

(Continued)

FOREIGN PATENT DOCUMENTS

| | | |
|---|---|---|
| DE | 442824 C | 5/1927 |
| DE | 10259258 A1 | 7/2004 |

(Continued)

OTHER PUBLICATIONS

International Search Report and Written Opinion for PCT/EP2017/051854, dated Mar. 23, 2017, 13 pages.

(Continued)

*Primary Examiner* — Daniel Whalen
(74) *Attorney, Agent, or Firm* — Patterson & Sheridan, LLP

(57) ABSTRACT

A method (200) for fabricating patterns on the surface of a layer of a device (100), the method comprising: providing at least one layer (130, 230); adding at least one alkali metal (235) comprising Cs and/or Rb; controlling the temperature (2300) of the at least one layer, thereby forming a plurality of self-assembled, regularly spaced, parallel lines of alkali compound embossings (1300, 1305) at the surface of the layer. The method further comprises forming cavities (236, 1300) by dissolving the alkali compound embossings. The method (200) is advantageous for nanopatterning of devices (100) without using templates and for the production of high efficiency optoelectronic thin-film devices (100).

20 Claims, 2 Drawing Sheets

(51) Int. Cl.
*B81C 1/00* (2006.01)
*H01L 21/02* (2006.01)
*H01L 31/0352* (2006.01)
*H01L 31/0392* (2006.01)
*H01L 31/042* (2014.01)

(52) U.S. Cl.
CPC .. *H01L 21/02568* (2013.01); *H01L 21/02664* (2013.01); *H01L 31/03529* (2013.01); *H01L 31/03926* (2013.01); *H01L 31/042* (2013.01); *B81C 2201/0149* (2013.01); *Y02E 10/541* (2013.01); *Y02P 70/521* (2015.11)

(56) References Cited

U.S. PATENT DOCUMENTS

| | | |
|---|---|---|
| 4,335,266 A | 6/1982 | Mickelsen et al. |
| 4,465,575 A | 8/1984 | Love et al. |
| 4,961,829 A | 10/1990 | Mainzer et al. |
| 5,141,564 A | 8/1992 | Chen et al. |
| 5,441,897 A | 8/1995 | Noufi et al. |
| 6,092,669 A | 7/2000 | Kushiya et al. |
| 6,258,620 B1 | 7/2001 | Morel et al. |
| 6,441,301 B1 | 8/2002 | Satoh et al. |
| 7,785,921 B1 | 8/2010 | Juliano et al. |
| 7,989,256 B2 | 8/2011 | Hakuma et al. |
| 8,193,028 B2 | 6/2012 | Lee |
| 8,328,999 B2 | 12/2012 | Moyama |
| 8,415,557 B2 | 4/2013 | Fukunaga et al. |
| 8,709,856 B2 | 4/2014 | Bartholomeusz et al. |
| 8,722,453 B2 | 5/2014 | Nakatani |
| 8,889,466 B2 | 11/2014 | Gershon et al. |
| 10,069,022 B2 | 9/2018 | Gwon |
| 10,109,761 B2 * | 10/2018 | Reinhard ............. H01L 31/186 |
| 10,396,218 B2 * | 8/2019 | Reinhard ........... H01L 31/02327 |
| 2001/0017154 A1 | 8/2001 | Washio |
| 2002/0106873 A1 | 8/2002 | Beck et al. |
| 2005/0202589 A1 | 9/2005 | Basol |
| 2006/0096635 A1 | 5/2006 | Tuttle |
| 2006/0145190 A1 | 7/2006 | Salzman et al. |
| 2008/0002336 A1 | 1/2008 | Zimmerman et al. |
| 2008/0012006 A1 | 1/2008 | Bailey et al. |
| 2008/0023336 A1 | 1/2008 | Basol |
| 2008/0156372 A1 | 7/2008 | Wu et al. |
| 2008/0169025 A1 | 7/2008 | Basol et al. |
| 2008/0210295 A1 | 9/2008 | Basol |
| 2008/0289680 A1 | 11/2008 | MacFarlane |
| 2009/0092744 A1 | 4/2009 | Pinarbasi et al. |
| 2010/0207515 A1 | 8/2010 | Moyama |
| 2010/0224247 A1 | 9/2010 | Bartholomeusz et al. |
| 2010/0229936 A1 | 9/2010 | Yago et al. |
| 2010/0248420 A1 | 9/2010 | Okamura et al. |
| 2010/0258191 A1 | 10/2010 | Mackie |
| 2010/0261304 A1 | 10/2010 | Chang et al. |
| 2011/0061706 A1 | 3/2011 | Park et al. |
| 2011/0073186 A1 | 3/2011 | Lai et al. |
| 2011/0177645 A1 | 7/2011 | Vasquez et al. |
| 2011/0186102 A1 | 8/2011 | Kobayashi et al. |
| 2011/0203634 A1 | 8/2011 | Wieting |
| 2011/0265845 A1 | 11/2011 | Nasuno et al. |
| 2012/0006395 A1 | 1/2012 | Boussaad et al. |
| 2012/0017986 A1 | 1/2012 | Nakatani |
| 2012/0064352 A1 | 3/2012 | Boussaad et al. |
| 2012/0067407 A1 | 3/2012 | Fujdala et al. |
| 2012/0080091 A1 | 4/2012 | Min et al. |
| 2012/0180870 A1 | 7/2012 | Yamamoto et al. |
| 2012/0201741 A1 | 8/2012 | Ionkin et al. |
| 2012/0214293 A1 | 8/2012 | Aksu et al. |
| 2012/0234375 A1 | 9/2012 | Nakamura et al. |
| 2012/0258567 A1 | 10/2012 | Aksu et al. |
| 2012/0313200 A1 | 12/2012 | Jackrel et al. |
| 2013/0160831 A1 | 6/2013 | Zubeck et al. |
| 2015/0027517 A1 | 1/2015 | Wieting |
| 2015/0333200 A1 | 11/2015 | Chirila et al. |
| 2015/0380589 A1 | 12/2015 | Teraji et al. |
| 2016/0268454 A1 | 9/2016 | Gwon |

FOREIGN PATENT DOCUMENTS

| | | |
|---|---|---|
| EP | 743686 A2 | 11/1996 |
| EP | 787354 A1 | 8/1997 |
| EP | 826983 A1 | 3/1998 |
| EP | 1291932 A2 | 3/2003 |
| EP | 2309548 A2 | 4/2011 |
| EP | 2339641 A2 | 6/2011 |
| EP | 2408023 A1 | 1/2012 |
| EP | 2463929 A1 | 6/2012 |
| WO | 2006076788 A1 | 7/2006 |
| WO | 2007072023 A1 | 6/2007 |
| WO | 2008088570 A1 | 7/2008 |
| WO | 2009076403 A1 | 6/2009 |
| WO | 2011040645 A1 | 4/2011 |
| WO | 2012037242 A2 | 3/2012 |
| WO | 2014097112 A1 | 6/2014 |
| WO | 2015/177748 A2 | 11/2015 |
| WO | 2015177748 A2 | 11/2015 |
| WO | 2016042432 A1 | 3/2016 |
| WO | 2017137268 A1 | 8/2017 |
| WO | 2017137271 A1 | 8/2017 |

OTHER PUBLICATIONS

Gavioli, L. et al., "Self-Assembling of Potassium Nanostructures on InAs (110) Surface," Surface Science, vol. 532-535, Jun. 1, 2003, pp. 666-670, Amsterdam, NL.

Chirila, A. et al.,"Potassium-Induced Surface Modification of Cu(In,Ga)Se2 Thin Films for High-Efficiency Solar Cells," Nature Materials, vol. 12, No. 12, Nov. 3, 2013, pp. 1107-1111.

Boutboul, T., et al.,"On the Surface Morphology of Thin Alkali Halide Photocathode Films," Nuclear Instruments & Methods in Physics Research. Section A: Accelerators, Spectrometers, Detectors, and Associated Equipment, Elsevier BV, North-Hollard, NL, vol. 438, No. 2-3, Dec. 11, 1999, pp. 409-414.

R. Wuerz et al. "CIGS Thin-Film Solar Cells and Modules on Enamelled Steel Substrates", Solar Energy Materials & Solar Cells. 2012.

Rudmann, D. (2004) Effects of sodium on growth and properties of Cu(In,Ga)Se2 thin films and solar cells, Doctoral dissertation, Swiss Federal Institute of Technology. Retrieved Sep. 17, 2012 from <URL: http://e-collection.ethbib.ethz.ch/eserv/eth:27376/eth-27376-02.pdf>.

Contreras et al. (1997) On the Role of Na and Modifications to Cu(In,Ga)Se2 Absorber Materials Using Thin-MF (M=Na, K, Cs) Precursor Layers, NREL/CP-520-22945.

Wuerz et al. (2011) CIGS thin-film solar cells and modules on enamelled steel substrates, Solar Energy Materials & Solar Cells 100 (2012) 132-137.

Chirila et al. (2011) Nature Materials 10, 857-861.

Johnson et al. (2002) Interface Properties of CIGS(S)/Buffer Layers Formed by the Cd-Partial Electrolyte Process, 29 th IEEE PVSC, May 20-24, 2002.

Xu et al. (2011) A novel one-step electrodeposition to prepare single-phase CuInS 2 thin films for solar cells, Solar Energy Materials & Solar Cells 95 (2011) 791-796.

Zhang et al. (2003) Formation of CuInSe 2 and Cu(In,Ga)Se 2 films by electrodeposition and vacuum annealing treatment, Solar Energy Materials & Solar Cells 80 (2003) 483-490.

Chinese Office Action dated Aug. 19, 2015 for Application No. 201280012915.3.

International Search Report and Written Opinion for PCT/IB2015/053736, dated Nov. 27, 2015.

Adrian Chirila, et al., "Potassium-Induced Surface Modification of Cu(In, Ga)Se2 Thin Films for High-Effeciency Solar Cells," Nature Materials, vol. 12. No. 12, Nov. 3, 2013, pp. 1107-1111.

Cojocaru-Miredin O., et al. "Exploring the P-N Junction Region OIn Cu(In,Ga) Sethin-Film Solar Cells at the Nanmeter-Scale," Applied Physics Letters, American Institute of Physics, US, vol. 101, No. 18, Oct. 29, 2012, pp. 181603-3.

Pyuck-Pa Choi, et al., "Compositional Gradients and Impurity Distributions in CuInSe2 Thin Film Solar Cells Studied by Atom

(56) References Cited

OTHER PUBLICATIONS

Probe Tomography," Surface and Interface Analysis, vol. 44, No. 11-12, Nov. 18, 2012, pp. 1386-1388.

Hunger, R., et al., "Removal of the Surface Investion of CuInSe2 Absorbers by NH3, aq Etchings," Proceedings of the 3rd World Conference on Photovoltaic Energy Conversion: Joint Conference of 13th PV Science & Engineering Conference, 30th IEEE PV Specialists Conference, 18th European PV Solar Energy Conference, May 18, 2003, pp. 556-569.

Balboul, M.R., et al., "Sodium Induced Phase Segreations in CuGaSe2 and CuInSe2 Thin Films," 17th E.C. Photovoltaic Solar Energy Conferenc, Munich Germany, Oct. 22-26, 2001; Proceedings of the International Photovoltaic Solar Energy Conference, Munich: WIP-Renewable Energies, DE vol. Conf. 17, Oct. 22, 2001, pp. 1015-1018.

Zribi, M. et al., "Optical Constants of Na-Doped CuInS2 Thin Films," Material Letters vol. 60, No. 1, Jan. 1, 2006, pp. 98-103.

Jehl, Z, et al., "Insights on the Influence of Surface Roughness on Photovoltaic Properties of State of the Art Copper Indium Gallium Diselenide Thin Films Solar Cells," Journal of Applied Physics, American Institute of Physics, US, vol. 111, No. 11, Jun. 1, 2012, pp. 114509-1-114509-7.

International Search Report and Written Opinion for PCT/EP2017/051830, dated Mar. 24, 2017.

Maeda et al., "First-principles study on alkali-metal effect of Li, Na, and K in CuInSe2 and CuGaSe2", Jpn. J. Appl. Phys. 54, O*KC20 (2015), Jul. 28, 2015, 9 pages.

Jackson et al., "Properties of Cu(In,Ga)Se2 solar cells with new record efficiencies up to 21.7%" P hys. Status Solidi RRL 9, No. 1, 28-31 (2015) / DOI 10.1002/pssr.201409520, Dec. 16, 2014, 4 pages.

PCT International Search Report and Written Opinion of International Application No. PCT/IB2015/056656, dated Nov. 17, 2015, 8 pages.

PCT International Search Report and Written Opinion of International Application No. PCT/EP2017/051854, dated Mar. 23, 2017, 8 pages.

Contreras et al. "On the Role of Na and Modifications to Cu(In,Ga)Se2 Absorber Materials Using Thin-MF (M=Na, K, Cs) Precursor Layers", Conf. Record of the 26th IEEE Photovoltaic Specialists Conf.—1997. pp. 359-362.

Rudmann, D. Effects of Sodium on Growth and Properties of Cu(In, Ga) Se2 Thin Films and Solar Cells, Doctoral Dissertation, Swiss Federal Institute of Technology.

Beucher, "The Watershed Transformation Applied to Image Segmentation", In 10th Pfefferkorn Conf. on Signal and Image Processing in Microscopy and Microanalysis. Sep. 16-19, 1991, pp. 299-314.

Wuerz et al. "CIGS Thin-Film Solar Cells and Modules on Enamelled Steel Substrates", Solar Energy and Solar Cells 100 (2012) 132-137.

Chirila et al. "Highly efficient Cu(In,Ga)Se2 solar cells grown on flexible polymer films" Nature Materials Letters, Sep. 18, 2011. pp. 857-861.

Boutboul et al. "On the Surface Morphology of Thin Alkali Halidle Photocathode Films", Nuclear Instruments and Methods in Physics Research A, vol. 438, No. 2-3, Dec. 11, 1999, pp. 409-414.

Reinhard et al. "Features of KF and NaF Post-Deposition Treatments of Cu (In, Ga) Se2 Absorbers for High Efficiency Solar Cells", Chemistry of Materials 27, 2015. pp. 5755-5764.

Gavioli et al. "Self-Assembling of Potassium Nanostructures on InAs (110) surface", Surface Science, vol. 532-535, Jun. 1, 2003, pp. 666-670.

\* cited by examiner

SELF-ASSEMBLY PATTERNING FOR FABRICATING THIN-FILM DEVICES

CROSS-REFERENCE TO RELATED APPLICATIONS

This application is a 371 U.S. National Stage of International Application No. PCT/EP2017/051854, filed Jan. 27, 2017, which application claims priority to International Application No. PCT/IB2016/050727, filed Feb. 11, 2016, the entire contents of which are incorporated by reference herein.

FIELD

The present invention relates to fabricating patterns at the surface of devices. It is applicable to solar cells, optoelectronic devices and/or devices manufactured by deposition of thin-films and more particularly to exploiting self-assembly properties of alkali halides to form features at the surface of a substrative layer, for example the absorber layer of optoelectronic devices comprising chalcogenide semiconductors or ABC semiconductive compounds.

BACKGROUND

Fabricating patterns on the surface of devices may confer new or improved properties and functions to said devices. Thin-films of alkali halides may exhibit self-assembly properties that may be employed to create patterns at the surface of layers.

Photovoltaic devices are generally understood as photovoltaic cells or photovoltaic modules. Photovoltaic modules ordinarily comprise arrays of interconnected photovoltaic cells. A thin-film photovoltaic or optoelectronic device is ordinarily manufactured by depositing material layers onto a substrate. A thin-film photovoltaic device ordinarily comprises a substrate coated by a layer stack comprising a conductive layer stack, at least one absorber layer, optionally at least one buffer layer, and at least one transparent conductive layer stack.

The present invention is also concerned with photovoltaic devices comprising an absorber layer generally based on an ABC chalcogenide material, such as an $ABC_2$ chalcopyrite material, wherein A represents elements in group 11 of the periodic table of chemical elements as defined by the International Union of Pure and Applied Chemistry including Cu or Ag, B represents elements in group 13 of the periodic table including In, Ga, or Al, and C represents elements in group 16 of the periodic table including S, Se, or Te. An example of an $ABC_2$ material is the $Cu(In,Ga)Se_2$ semiconductor also known as CIGS. The invention also concerns variations to the ordinary ternary ABC compositions, such as copper-indium-selenide or copper-gallium-selenide, in the form of quaternary, pentanary, or multinary materials such as compounds of copper-(indium, gallium)-(selenium, sulfur), copper-(indium, aluminium)-selenium, copper-(indium, aluminium)-(selenium, sulfur), copper-(zinc, tin)-selenium, copper-(zinc, tin)-(selenium, sulfur), (silver, copper)-(indium, gallium)-selenium, or (silver, copper)-(indium, gallium)-(selenium, sulfur).

The photovoltaic absorber layer of thin-film ABC or $ABC_2$ photovoltaic devices can be manufactured using a variety of methods such as chemical vapor deposition (CVD), physical vapor deposition (PVD), spraying, sintering, sputtering, printing, ion beam, or electroplating. The most common method is based on vapor deposition or co-evaporation within a vacuum chamber ordinarily using multiple evaporation sources. Historically derived from alkali material diffusion using soda lime glass substrates, the effect of adding alkali metals to enhance the efficiency of thin-film $ABC_2$ photovoltaic devices has been described in much prior art (RUDMANN, D. (2004) Effects of sodium on growth and properties of $Cu(In,Ga)Se_2$ thin films and solar cells, Doctoral dissertation, Swiss Federal Institute of Technology. Retrieved 2014 Apr. 30 from <URL: http://e-collection.ethbib.ethz.ch/eserv/eth:27376/eth-27376-02.pdf>).

Thin-films of alkali halides are known to form island structures (BOUTBOUL, T. et al. On the Surface Morphology of Thin Alkali Halide Photocathode Films. Nuclear Instruments and Methods in Physics Research A 438 (1999) 409-414).

The present invention presents a method to form nanometric patterns, or nanopatterns at the surface of a device, for example an optoelectronic device's thin-film layer, preferably the device's absorber layer. The present invention builds upon a previous filing (PCT/IB2015/056656 claiming priority of 18 Sep. 2014) referred to as "previous filing" in this description. The nanopatterns may comprise rows or arrays of alkali crystals or compounds of alkali crystals formed by deposition of at least one alkali material onto a thin-film layer. The nanopatterns may also comprise rows or arrays of cavities formed by selectively dissolving said alkali crystals and underlying material that underwent a reaction with said alkali crystals. Said nanopatterns are ordinarily formed into a portion of the thickness of the thin-film layer onto which the alkali material is deposited. Said nanopatterns may also be formed into at least one thin-film layer deposited after deposition of said alkali material. The method may advantageously modify at least one thin-film layer's chemical composition, enlarge developed total surface, enlarge developed surface adequate for receiving doping elements, form point contacts with subsequently deposited thin-film layers, form patterns in subsequently deposited thin-film layers, form patterns that confer specific properties to the device, form patterns that confer new functions to the device. The method may also enable tuning of the device through control of pattern properties such as mean area, spatial density, spatial frequency, mean hole size, or area coverage, of cavities, respectively alkali crystals.

In this document, we define alkali metal as being alkali metal in elemental form or precursor thereof.

The present invention exploits adding at least one alkali metal to a layer, for example to the absorber layer of a thin-film optoelectronic device. The invention especially exploits, under control of layer temperature, self-assembly properties of adding the at least one alkali metal to a layer so as to form patterns. For example, adding at least one alkali metal to a layer modifies at least the physical appearance of the surface of the layer and possibly also the chemical content of the layer. Further treating of at least the surface of the absorber layer will modify its physical appearance to reveal concave nanostructures or nanopatterns. Treating of absorber surface may for example be done with a bathing apparatus. The invention discloses independent control of separate alkali metals during adding to layers of the optoelectronic device, the treating of the absorber surface, and the resulting chemical and physical modifications to at least one absorber layer of the optoelectronic device. Effects of the invention on at least one of the device's thin-film layers include at least one of doping, passivation of absorber surface, interfaces, grain boundaries, and defects, elemental interdiffusion, forming of point contacts, forming of nanoholes of controlled dimensions and spatial distribution, modification of layer roughness, optical characteristics, and optoelectronic characteristics such as enhanced open circuit voltage and fill factor. The invention's adding of at least one alkali metal and treating absorber surface enables manufacturing of a thinner optimal buffer layer. In some cases a person skilled in the art may advantageously omit manufacturing the buffer layer. This thinner optimal buffer layer results in reduced optical losses, thereby contributing to increase an optoelectronic device's photovoltaic conversion efficiency.

SUMMARY

This invention presents a solution to the problem of, for example, precisely controlling and tuning the manufacturing of nanopatterns on a layer. The invention may especially be applicable to the manufacturing of high efficiency thin-film photovoltaic or optoelectronic devices that comprise an $ABC_2$ chalcopyrite absorber layer. The invention is also applicable to flexible photovoltaic devices with said absorber layer. It is also applicable to devices manufactured onto substrates, such as polyimide, that do not comprise within the substrate alkali metals known to augment photovoltaic conversion efficiency by diffusion into at least the absorber layer.

As an example for an application of manufacturing of nanopatterns on a layer, the invention presents photovoltaic (abbreviated PV) devices that, among alkali materials comprised in the absorber layer, comprises an amount of Cs and/or Rb. The invention also describes some characteristics of said devices. The invention also presents a method for manufacturing said devices with the advantage of reduced optical losses, reduced carrier recombinations in the absorber and at the interfaces with the absorber, and therefore enhanced photovoltaic conversion efficiency. Although the method is applicable to production on glass, metal, or various coated substrates, the method is especially advantageous for the production of flexible photovoltaic devices based on polymer substrates. Devices manufactured according to said method have higher photovoltaic efficiency, possibly lower temperature coefficient and possibly less unwanted material than equivalent devices manufactured using methods described in prior art.

A common problem in the field of thin-film (abbreviated TF) PV devices relates to doping of the photovoltaic absorber layer for increased efficiency. When manufactured onto glass substrates or possibly onto substrates coated with materials comprising alkali metals, the substrate's alkali metals may diffuse into the absorber layer and increase PV conversion efficiency. In the case of substrates, such as polyimide, that do not comprise alkali metals, the alkali-doping elements must be supplied via deposition techniques such as, for example, physical vapor deposition. Alkali metals may for example be supplied as a so-called post deposition treatment. The alkali metals diffuse during the deposition process within and across various TF layers and their interfaces.

Another problem in the field of TF PV devices concerned with doping relates to controlling doping of specific areas or specific zones along the thin-film's thickness of the semiconductive material.

A further problem in the field of TF PV devices concerned with doping relates to preparing the surface, for example relates to increasing the overall surface, made available for doping.

Yet a further problem in the field of TF PV devices relates to damage to the CIGS that may be caused by post-CIGS deposition treatments.

A problem in the field of TF PV devices is the occurrence of carrier recombination which results in loss of PV conversion efficiency.

Another problem in the field of TF PV devices lies at the interfaces between the absorber layer, the optional buffer layer, and the front-contact layer: semiconductive junction points that desirably interface as point contacts with high conductivity to the front-contact layer must be well distributed across the layer's surface. It may be advantageous to tune at least one of areal density, spatial distribution, or spatial uniformity of said point contacts to the thin-films' semiconductive properties.

A further problem in the field of TF PV devices is that for some buffer layer compositions, the thicker the buffer layer, the lower its optical transmittance and therefore the lower the PV device's conversion efficiency.

Yet a further problem in the field of TF PV devices is that some buffer layer compositions, such as CdS, comprise the element cadmium, the quantity of which it is desirable to minimize.

Another problem in the field of TF PV device manufacturing is that the process for deposition of the buffer layer, such as chemical bath deposition (CBD), may generate waste. In the case of CdS buffer layer deposition the waste requires special treatment and it is therefore desirable to minimize its amount.

Yet another problem in the field of flexible TF PV device manufacturing is that it is desirable to benefit from large process windows for material deposition, and more specifically in relation to this invention, the process window for the adding of alkali metals and subsequent deposition of at least one buffer layer.

A problem in the field of TF device manufacturing is that it may be desirable to manufacture thin-film layers with spatially uniform nanopatterns.

A problem in the field of TF device manufacturing is that it may be desirable to manufacture a plurality of superimposed thin-film layers with spatially corresponding nanopatterns.

A problem in the field of manufacturing nanopatterns in thin-film devices is that precise manufacturing of said nanopatterns may require labor-intensive and time-consuming processes to form features of said nanopatterns.

Another problem in the field of manufacturing nanopatterns in thin-film devices is that precise manufacturing of said nanopatterns on top of rough or polycrystalline surfaces may be desirable.

Finally, a problem in the field of TF PV devices is that of the color of the device and possibly also the uniformity of the color across the device's surface. This problem may be even more important in the context of assemblies of PV devices, such as large PV modules, where multiple devices are placed next to each other and a desired match between the color of devices is desired. This may be for example to manufacture assemblies of PV devices of uniform color. It may also be to manufacture PV assemblies where different colors among PV devices are used to design patterns, writings, or gradients.

Briefly, the invention thus pertains to a method of controlling and tuning the manufacturing of nanopatterns on a layer. The invention is for example applicable to fabricating TF PV devices comprising at least one ABC2 chalcopyrite absorber layer. The invention comprises adding at least one alkali metal comprising Rb and/or Cs, thereby forming alkali crystals that self-assemble and embed themselves into the surface of a layer or react with a small portion of the underlying material to give it modified physical and chemical properties as that of the layer, such as a PV device's absorber layer, to form embossings. The alkali crystals may further be selectively dissolved, thereby leaving cavities at the surface of the layer in which initial embedding occurred. Embedded alkali crystals may also be selectively dissolved after at least one subsequent layer is deposited onto the layer where alkali crystals were initially embedded. The layers may also be subject to further treatment which may also contribute to dissolving embedded alkali crystals. Resulting devices, or TF PV devices, such as those comprising at least one $ABC_2$ chalcopyrite absorber layer, may be characterized as having on at least a region of their surface a plurality of cavities of nanoscopic scale. The cavities are arranged, through self-assembly, into parallel lines of regularly distributed cavities, the cavities having a long axis that is collinear with said line.

For the purposes of the present invention, the term "adding" or "added" refers to the process in which chemical elements, in the form of individual or compound chemical elements, namely Cs and/or Rb possibly with other alkali metals and their so-called precursors, are being provided in the steps for fabricating the layer stack of a device, for example an optoelectronic device, for any of:

forming patterns on the surface of at least one layer, said patterns resulting from the forming and self-assembly of aggregates comprising Cs and/or Rb possibly with other alkali metals, or forming a solid deposit where at least some of the provided chemical elements will diffuse into at least one layer of said layer stack, or simultaneously providing chemical elements to other chemical elements being deposited, thereby forming a layer that incorporates at least some of the provided chemical elements and the other elements, or depositing chemical elements onto a layer or layer stack, thereby contributing via diffusion at least some of the provided chemical elements to said layer or layer stack.

In greater detail, the method for fabricating patterns on the surface of a layer of a device comprises providing at least one layer; adding at least one alkali metal comprising Cs and/or Rb; controlling the temperature of the at least one layer, thereby forming a plurality of embossings at the surface of the at least one layer, at least a portion of the plurality of embossings resulting from a self-assembly process comprising: the forming of a plurality of alkali crystal compounds from the at least one alkali metal and the self-assembling and the embedding of the alkali crystal compounds into the surface of the at least one layer, thereby forming at least a first line of regularly spaced embossings that is adjacent and parallel to at least a second line of regularly spaced embossings within at least one region of the at least one layer.

In said method, at least one alkali metal comprises Cs and/or Rb. The step of adding of at least one alkali metal may also comprise adding at least one element in group 16 of the periodic table including S, Se, and Te. Furthermore, the layer may comprise an ABC chalcogenide material, including ABC chalcogenide material quaternary, pentanary, or multinary variations, wherein A represents elements of group 11 of the periodic table of chemical elements as defined by the International Union of Pure and Applied Chemistry including Cu and Ag, B represents elements in group 13 of the periodic table including In, Ga, and Al, and C represents elements in group 16 of the periodic table including S, Se, and Te. The layer may for example comprise Cu(In,Ga)Se2. The step of controlling the temperature may comprise controlling the temperature in a range from about 250° C. to about 380° C., preferably in a range from about 300° C. to about 370° C. The method may further comprise coating at least a portion of the at least one layer with a functional layer. Furthermore, the method may comprise a step of forming at least one cavity by dissolving at least a portion of at least one of the alkali crystal compounds, said step comprising, on at least a portion of a layer surface where at least a portion of at least one of the alkali crystal compounds is exposed, at least one of the steps of: forming at least one buffer layer; treating the layer surface by adding oxidation state +1/+2 elements to the layer surface; aqueous wetting with a solution comprising water; aqueous wetting with a diluted aqueous ammonia solution with a diluted ammonia molarity in the range from 0 to 20 M, preferably in the range from about 1 M to 10 M, more preferably in the range from about 2 M to 4 M. Additionally, the method may comprise filling at least a portion of the at least one cavity by forming a filler layer onto at least one cavity. The layer may be delivered between a delivery roll and a take-up roll of a roll-to-roll manufacturing apparatus.

The inventive method can also comprise adding the alkali earth metals Be, Mg, Ca, Sr and Ba in combination with Rb and Cs and possibly other alkali metals, in the following proportions: 1/20000 to 10, preferably 1/100 to 1/5. This may allow controlling the size and distribution of the self assembled crystals and resulting embossings.

The invention also pertains to a device obtainable by the described method, comprising: at least one layer; a plurality of embossings at the surface of said at least one layer, at least a portion of the plurality of embossings resulting from a self-assembly process comprising: the forming of a plurality of alkali crystal compounds from at least one alkali metal and the self-assembling and the embedding of the alkali crystal compounds into the surface of the at least one layer, thereby forming at least a first line of regularly spaced embossings that is adjacent and parallel to at least a second line of regularly spaced embossings within at least one region of the at least one layer. Also, the at least one alkali metal comprises Cs and/or Rb. The long axis of at least one embossing in at least one line of regularly spaced embossings may be about collinear with said line. The at least one line of regularly spaced embossings may be embossed along at least one crystal striation of at least one region of the surface of the at least one layer. At least one region may be comprised on a surface of a crystal at the surface of the at least one layer. At least one embossing may be comprised in the at least one layer and at least one functional layer. At least one embossing may have the shape of a cavity in at least one layer. At least one embossing may comprise an electrical point contact between said substrative layer and at least one filler layer, at least some material of which is comprised within said embossing. At least one layer may comprise a reacted layer. Furthermore, at least one layer may comprise an ABC chalcogenide material, including ABC chalcogenide material quaternary, pentanary, or multinary variations, wherein A represents elements of group 11 of the periodic table of chemical elements as defined by the International Union of Pure and Applied Chemistry including Cu and Ag, B represents elements in group 13 of the periodic table including In, Ga, and Al, and C represents elements in group 16 of the periodic table including S, Se, and Te. The at least one layer may comprise Cu(In,Ga)Se2. The device may be a thin-film optoelectronic device. The device may comprise a flexible substrate.

ADVANTAGES

A main advantage of the invention is that it may enable, via self-assembly, to control the production of uniform and oriented embossed nanopatterns on devices such as thin-film devices. The self-positioning and uniform distribution of the embossed nanopatterns may therefore be less labor-intensive than other methods that use templates, lithography, or laser drilling.

Another advantage of the invention is that it may enable, in a single manufacturing step with reduced and more efficient consumption of chemical products, the fabrication of regular embossings in the absorber layer surface of an optoelectronic device. The invention is also advantageous for the single-step fabrication of regular embossings in multiple layers that coat a substrative layer, such as an absorber layer, where embossings have previously self-assembled to form regular nanopatterns. The invention contributes advantageous features of surface nanostructuring, reduced surface damage, doping, buried and discrete semi-conductive junction formation, and formation of point contacts. The resulting devices, for example photovoltaic devices based on a CIGS absorber layer, may also feature reduced or no cadmium content.

Advantages of the invention derive from a method of adding substantial amounts of alkali elements namely Cs and/or Rb to a layer, such as a PV device's absorber layer, and controlling the temperature to enable the self-assembly and embedding of regularly spaced and oriented alkali crystals into the layer. A subsequent step may include selectively dissolving the alkali crystals to form embossings of nanocavites and optionally adding oxidation state +1 and/or +2 elements to the absorber layer. High efficiency PV devices resulting from the method may be advantageous, thanks to a thinner or an absence of buffer layer, over prior art devices where little or no alkali elements have been added. The method may also be advantageous over prior art devices where no nanocavities have been formed. An advantageous effect of the invention is that the optimal thickness for an optional buffer layer coating said absorber layer may be thinner than the optimal buffer layer needed for prior art PV devices with comparable PV efficiency. The invention may shorten the manufacturing process, reduce environmental impact of manufacturing and of the resulting device, and increase device PV conversion efficiency.

The invention's features may advantageously solve several problems in the field of optoelectronics, TF PV devices manufacturing, and more specifically manufacturing of the absorber and buffer layer of such devices. The listed advantages should not be considered as necessary for use of the invention. For manufacturing of optoelectronic devices, preferably TF flexible PV devices, manufactured to the present invention, the advantages obtainable over devices and their manufacturing according to prior art include:

Higher PV conversion efficiency,
Improved absorber doping, especially towards the part of the layer that is closest to the front-contact layer,
Control of doping spatial distribution
Absorber layer nanostructuring that improves dopant effect and contributes to the formation of point contacts with the front-contact layer that are regularly distributed and uniformly sized,
Improved semiconductor junction that helps reduce carrier recombinations,
Reduced semiconductor bulk defects that help reduce carrier recombinations,
Tuning of areal density, spatial distribution, or spatial uniformity of point contacts,
Forming of spatially uniform nanopatterns,
Forming of a plurality of thin-film layers with spatially corresponding nanopatterns,
Fast and low-cost forming of nanopatterns in thin-film layers,
Thinner or omitted buffer layer,
Shorter buffer layer deposition time,
Enlarged buffer layer deposition process window,
Enlarged deposition process window for alkali metal doping elements,
Increase in open-circuit voltage resulting from a decrease in recombination-relevant surface,
Enlarged tuning window for (In, Ga) addition to the CIGS absorber layer,
Improved copper to cadmium interface resulting in lower cadmium content in device,
Facilitated growth of stoichiometric absorber material,
More environmentally-friendly manufacturing process and devices,
Lower manufacturing costs,
Adjustment of PV device color, spatial color uniformity, and/or reflectance.

BRIEF DESCRIPTION OF FIGURES

Embodiments of the invention will now be described by way of example, with reference to the accompanying drawings, in which.

DETAILED DESCRIPTION

Figure 1A:
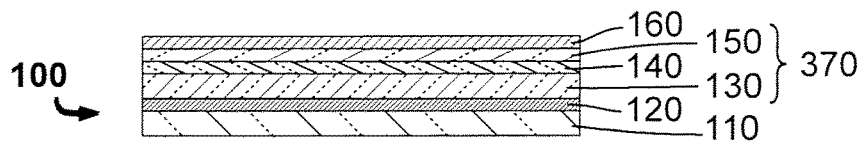
FIG. 1A is a cross-section of an embodiment of a thin-film optoelectronic device.

In simplified terms, the following description details a device comprising a layer that comprises a plurality of embossings forming nanopatterns. The device is preferably an optoelectronic device, for example a TF PV device, and the layer is for example the device's absorber layer. The nanopatterns may comprise rows or arrays of alkali crystals or alkali crystal compounds including Cs and/or Rb—in the following the term alkali crystals will be used to designate any compound comprising at least one crystal that comprises an alkali element comprising Cs and/or Rb—formed by deposition of at least one alkali material onto a thin-film layer. The nanopatterns may also comprise rows or arrays of concave embossings, or cavities, formed by selectively dissolving said alkali crystals. The shape, location, and spatial distribution of the cavities, or nanocavities, correspond to the geometry and topology of the alkali crystals prior to their dissolving to form said cavities. In the following, metrics describing cavities may ordinarily be generalized to embossings. A convex embossing may be understood as an alkali crystal that is at least partly embedded into a layer used as a substrative layer, for example a PV device's absorber layer. A cavity, or a concave embossing, may be understood as the shape remaining in a substrative layer, and possibly subsequently deposited layers, after subjecting an alkali crystal to selective dissolving. The size of an embossing may range from at least 2 to 800 nm, possibly larger. The distance from a first embossing's centroid to a nearest second embossing's centroid, may range from 0 to 500 nm, possibly further. Although the shape of the cavities is preferably rectangular, the shape more generally derives from cubic or aggregates of cubic crystals. The shape may also be rectangular, tetragonal, pyramidal, and possibly circular, or elliptic. The shape of cavities is a function of step temperatures and step durations used in the manufacturing method. The shape is also a function of the presence of other elements (for example comprising Na, K and alkali earth elements) added simultaneously during the adding of Cs and/or Rb that contribute to forming the alkali crystals. The surface of the absorber layer may also be doped. The forming of said crystals contributes to the doping. As an example for manufacturing an optoelectronic device, the description also details a method to manufacture a TF PV device, parameters to grow the alkali crystals that are embedded into the surface of the absorber layer of the device, how to selectively dissolve said crystals without damaging the absorber layer, how to dope the surface of the absorber layer within the overall manufacturing process, and how to control the nanopatterning of the absorber layer. In effect, by forming nanopatterns of cavities, the method may uniformly increase the total surface available to dope the surface of the absorber layer and at the same time reduce the volume within the absorber layer where detrimental carrier recombination may occur.

The invention is applicable to substrates that may or substrates that may not diffuse alkali elements into thin-film layers. For example the method is applicable to alkali-nondiffusing substrates. An "alkali-nondiffusing substrate" is a component, ordinarily a sheet of material, that comprises no alkali or so little alkali that diffusion of potassium or other alkali elements into the subsequently described layers is considered too small to significantly alter the optoelectronic properties of the device. Alkali-nondiffusing substrates also include substrates that comprise means to prevent diffusion of Cs and/or Rb into coatings or layers supported by the substrate. An alkali-nondiffusing substrate may for example be a substrate that has been specially treated or coated with a barrier layer to prevent diffusion of alkali elements into coatings or layers supported by the substrate. Specially treated substrates or barrier-coated substrates ordinarily prevent the diffusion of a broad range of elements, including alkali metals, into coatings or layers supported by the substrate.

For clarity, components in figures showing embodiments are not drawn at the same scale.

FIG. 1A presents the cross-section of an embodiment of a TF optoelectronic or a PV device 100 comprising a substrate 110 for a stack of material layers.

Substrate 110 may be rigid or flexible and be of a variety of materials or coated materials such as glass, coated metal, polymer-coated metal, polymer, coated polymer such as metal-coated polymer, or flexible glass. A preferred flexible substrate material is polyimide as it is very flexible, sustains temperatures required to manufacture high efficiency optoelectronic devices, requires less processing than metal substrates, and exhibits thermal expansion coefficients that are compatible with those of material layers deposited upon it. Industrially available polyimide substrates are ordinarily available in thicknesses ranging from 7 µm to 150 µm. Substrate 110 may be an alkali-nondiffusing substrate. Polyimide substrates are ordinarily considered as alkali-nondiffusing.

At least one electrically conductive layer 120 coats substrate 110. Said electrically conductive layer, or stack of electrically conductive layers, also known as the back-contact, may be of a variety of electrically conductive materials, preferably having a coefficient of thermal expansion (CTE) that is close both to that of the said substrate 110 onto which it is deposited and to that of other materials that are to be subsequently deposited upon it. Conductive layer 120 preferably has a high optical reflectance and is commonly made of Mo although several other TF materials such as metal chalcogenides, molybdenum chalcogenides, molybdenum selenides (such as MoSe2), Na-doped Mo, K-doped Mo, Cs-doped Mo, Rb-doped Mo, Na, K, Cs, and/or Rb (and combinations thereof)-doped Mo, transition metal chalcogenides, doped indium oxides, for example tin-doped indium oxide (ITO), non-doped indium oxides, doped or non-doped zinc oxides, zirconium nitrides, tin oxides, titanium nitrides, Ti, W, Ta, Au, Ag, Cu, and Nb may also be used or included advantageously.

At least one absorber layer 130, which is also referred to herein as a substrative layer 130, coats electrically conductive layer 120. Absorber layer 130 is made of an ABC material, wherein A represents elements in group 11 of the periodic table of chemical elements as defined by the International Union of Pure and Applied Chemistry including Cu or Ag, B represents elements in group 13 of the periodic table including In, Ga, or Al, and C represents elements in group 16 of the periodic table including S, Se, or Te. An example of an ABC2 material is the Cu(In,Ga)Se2 semiconductor also known as CIGS.

Optionally, at least one semiconductive buffer layer 140 coats absorber layer 130. Said buffer layer ordinarily has an energy bandgap higher than 1.5 eV and is for example made of materials such as cadmium sulfides, CdS, Cd(S,OH), CdZnS, indium sulfides, zinc sulfides, gallium selenides, indium selenides, compounds of (indium, gallium)-sulfur, compounds of (indium, gallium)-selenium, tin oxides, zinc oxides, Zn(Mg,O)S, Zn(O,S) material, or variations thereof.

At least one transparent conductive front-contact layer 150 coats buffer layer 140. Said transparent conductive layer, also known as the front-contact, ordinarily comprises a transparent conductive oxide (TCO) layer, for example made of doped or non-doped variations of materials such as indium oxides, tin oxides, or zinc oxides, indium tin oxides, fluorine-doped tin oxides, hydrogen-doped indium oxides, doped indium oxides. Optionally, the place of buffer layer 140 may be replaced by other types of transparent layers, for example a transparent conductive front-contact layer 150.

Contributing to this invention, for example when applied to an optoelectronic device, preferably a PV device, the amount of Cs and/or Rb comprised in the interval of layers 370 from electrically conductive back-contact layer 120, exclusive, to transparent conductive front-contact layer 150, inclusive, the comprised amounts resulting from adding the alkali metals are, for Rb and/or Cs, in the range of 200 to 10000, preferably 500 to 2500, more preferably 1000-2250 or 1500-2000 atoms per million atoms (ppm) and, where another alkali metal is present, the other alkali metal(s) is/are in the range of 5 to 10000 ppm and at most 3/2, preferably at most 1/2, and at least 1/2000 of the comprised amount of Rb and/or Cs. A TF PV device demonstrating superior PV conversion efficiency preferably has an amount of Cs and/or Rb comprised in said interval of layers 370 in the range between 500 and 2000 Cs and/or Rb atoms per million atoms. For a device comprising at least two alkali metals, one of which is Cs and/or Rb, the amount of said at least one alkali metal other than Cs and/or Rb may be in the range of 5 to 5000 ppm. the amount of at least one alkali metal other than Cs and/or Rb is at most 3/2, preferably 1/2 and at least 1/2000 of the comprised amount of Cs and/or Rb.

Optionally, front-contact metallized grid patterns 160 may cover part of the transparent conductive front-contact layer 150 to advantageously augment front-contact conductivity. Also optionally, said TF PV device may be coated with at least one anti-reflective coating such as a thin material layer or an encapsulating film.

Figure 1B:
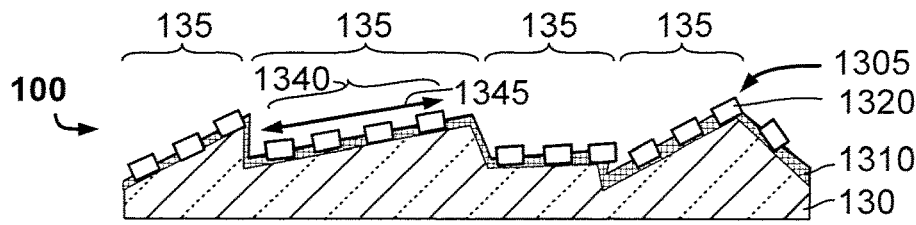
FIGS. 1B-1J are partial device cross-sections detailing the formation of embossings, FIGS. 1D, 1G and 1I being perspective views.

FIG. 1B presents a detail of a partial cross-section of an embodiment of a device 100 with a layer 130 coated by a plurality of alkali crystals 1320 including Cs and/or Rb based crystals. The partial cross-section is preferably a partial cross-section of a TF optoelectronic device, for example the TF PV device 100 of FIG. 1A. FIG. 1B shows part of a layer 130 acting as a substrative layer 130 for alkali crystals 1320. In this context, the alkali crystals 1320 form a plurality of embossings, in this context convex embossings 1305, onto at least the substrative layer 130. The substrative layer 130 is preferably a thin-film layer, for example the absorber layer 130 of FIG. 1A. The substrative layer 130 may comprise a plurality of substrative layer crystals, each substrative crystal comprising regions of substrative layer crystal 135 where a plurality of said embossings may form. The surface of the substrative layer therefore comprises a plurality of regions of substrative layer crystals 135 that expose at least parts of faces of the substrative layer's crystals. For example, if substrative layer 130 is a CIGS absorber layer, said substrative crystals are chalcopyrite grains, or crystallites. The surface of substrative layer 130 is coated by a plurality of alkali crystals 1320. The alkali crystals are preferably non-connected single crystals. The alkali crystals may also comprise non-connected assemblies of alkali crystals, for example assemblies of crystals may comprise twinned crystals. Said alkali crystals preferably have a shape resembling a rectangular parallelepiped. The alkali crystals may at least be partly embedded into the surface of the underlying substrative layer 130. Preferably, a plurality of alkali crystals may be aligned and form a line 1340 of embossings 1300. Said line of embossings may be oriented along a direction of line of embossings 1345. In FIG. 1B the line of embossings comprises the alkali crystals and therefore forms a line of convex embossings. The surface of the layer 130 may optionally comprise a portion of reacted layer 1310. For example, in the case of a CIGS absorber layer 130, the reacted layer 1310 may comprise Se and may also comprise elements diffusing from the substrative layer. The reacted layer 1310 therefore comprises a combination, or a mixture, of alkali salts, Cu, In, Ga, and/or Se.

Figure 1C:

FIG. 1C presents the partial cross-section of an embodiment of a device 100 of FIG. 1B after selective dissolving of at least one alkali crystal, ordinarily a plurality of alkali crystals. The dissolving results in forming at least one cavity of an embossing 1300, ordinarily a plurality of cavities of embossings 1300. The cavities may be understood as the concave embossings 1300 that are counterpart to the convex embossings 1305 of FIG. 1B.

The embossings, whether they are convex embossings 1305 comprising alkali crystals 1320 of FIG. 1B or concave embossings 1300 of FIG. 1C, may be immersed at various depths into the layer 130: they may be positioned against the surface of the layer 130, partly immersed into the reacted layer 1310, partly immersed into the layer 130 and partly immersed below the reacted layer 1310, immersed to be flush with the surface of the layer, immersed to be flush with the surface of the reacted layer, or even immersed below the overall surface of the layer or the reacted layer within the corresponding region of the substrative layer crystal 135. A given line 1340 of embossings 1300, 1305 may comprise embossings that are immersed over a plurality of depths into the layer 130.

Figure 2:
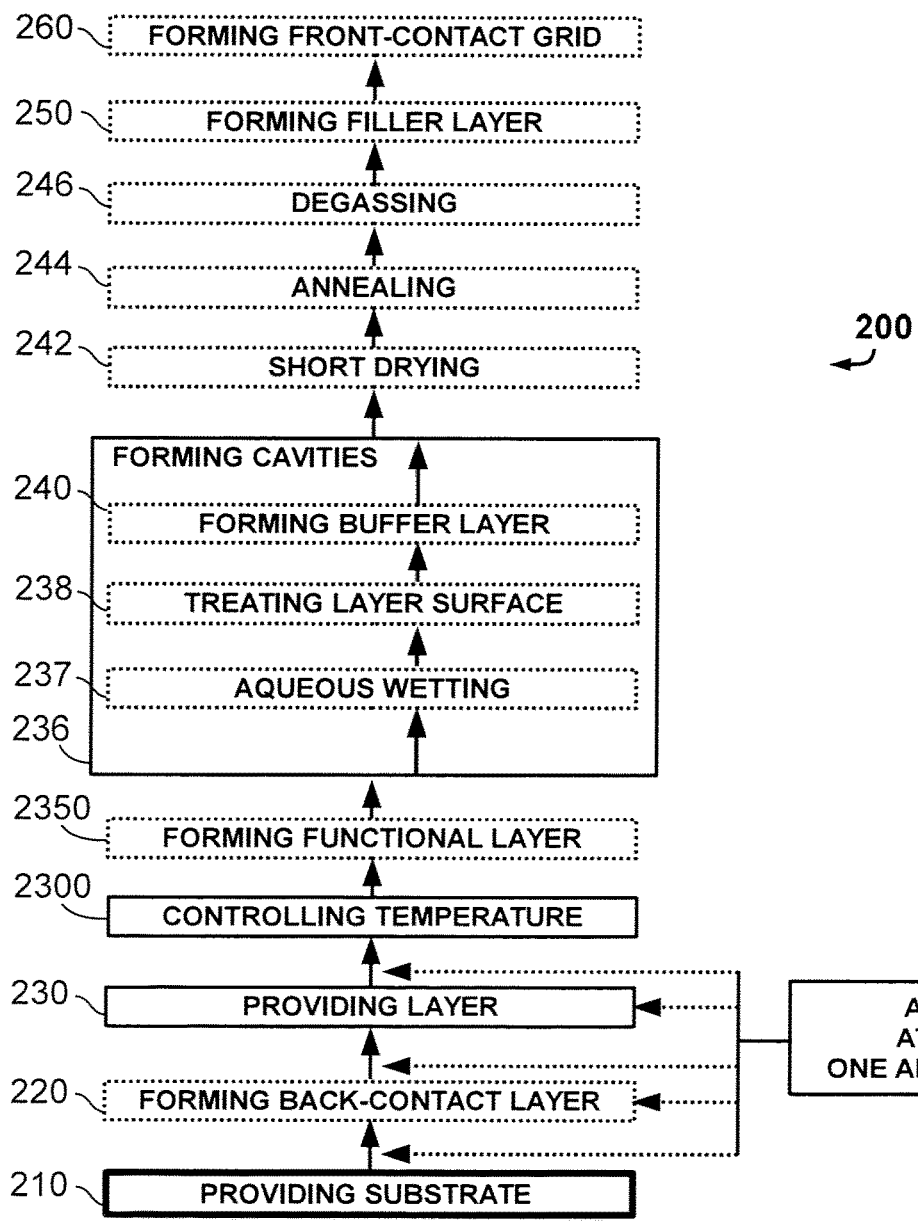
FIG. 2 presents steps in a method to manufacture a thin-film device comprising self-assembled patterns.

Also, a portion of the surface of absorber or substrative layer 130 may comprise at least one oxidation state +1 element and/or at least one oxidation state +2 element (see description for FIG. 2). Said oxidation state elements may for example be present at the location of at least one embossing, more preferably the location of at least one concave embossing. On the cross-section of the TF device, the surface of the absorber or substrative layer 130 may be defined as the region in which the embossings 1300, 1305 extend into the layer and additionally up to about 80 nm, preferably 50 nm, further into the layer 130. Consequently, layer 130 may mostly be a p-type absorber. At its surface, for example at the location of at least one embossing, in contact with at least one of buffer layer 140 or front-contact layer 150, it may comprise n-type absorber material. Layer 130 may therefore comprise at least one homojunction, preferably a plurality of homojunctions. Said homojunctions may be located at the embossings, preferably concave embossings, preferably within the absorber layer material surrounding said embossings comprised in a radius of about 100 nm. An example of homojunction for an ABC2 absorber layer is a p-type CIGS absorber layer comprising n-type CIGS at the surface. Furthermore, the surface of the absorber layer, for example at the location of at least one concave embossing, may also comprise at least one heterojunction, preferably a plurality of heterojunctions. Said heterojunction may for example comprise a p-type CIGS absorber layer combined with n-type material such as CdS, Cd(S,OH), Cd(O,H), CdZnS, KInSe2, CsInSe2, RbInSe2, indium sulfides, zinc sulfides, gallium selenides, indium selenides, compounds of (indium, gallium)-sulfur, compounds of (indium, gallium)-selenium, tin oxides, zinc oxides, Zn(Mg,O)S, Zn(O,S), alkali selenides, alkali sulfides, or variations thereof.

Figure 1D:
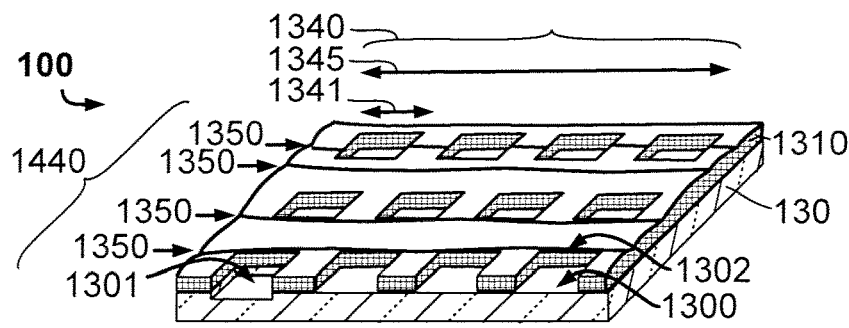

FIG. 1D is a perspective view of a region of a substrative layer crystal 135 comprising a plurality of concave embossings 1300, or cavities. The region of a substrative layer crystal 135 comprises at least one line 1340 of regularly spaced embossings 1300. Said region 135 may also comprise at least a first line 1340 of regularly spaced embossings 1300 that is parallel to at least a second line 1340 of regularly spaced embossings 1300. Said region 135 may also comprise a set or mesh 1440 comprising a plurality of parallel lines 1340, each line comprising regularly spaced embossings 1300. In said set 1440, the spacing between embossings in a first line 1340 may be different from the spacing of embossings in a second line 1340. Said region 135 may therefore result in a mesh of substrative layer 130 into which embossings 1300, 1301 have formed. More generally, a device may comprise a plurality of regions with a plurality of embossing patterns arranged in a plurality of directions. A device may also comprise regions with embossing aligned in patterns and regions where embossings appear randomly positioned.

Crystals of the substrative layer 130 may comprise crystal striations 1350 that may act as guides for forming lines 1340 of embossings 1300, 1305. Said crystal striations 1350 are ordinarily naturally occurring formations resulting from the growth of the crystals that form the substrative layer 130. The crystal striations may therefore contribute to the self-assembly of alkali crystals 1320 and enable self-positioning and self-alignment of the alkali crystals and subsequent embossings without having to use template-based or lithographic methods. The orientation 1345 of at least one line 1340 in said region 135 may be parallel to that of at least one crystal striation 1350 of at least one region 135 of the surface of the at least one layer 130. A line 1340 of regularly spaced embossings may adopt a variety of positions with respect to a crystal striation 1350: said line 1340 may for example overlap and be collinear with at least one crystal striation 1350; said line may comprise at least one embossing, the long side 1302 of which is flush against at least one crystal striation; said line may be comprised between at least two said crystal striations and parallel to at least one crystal striation. The long side 1302 of at least one embossing 1300, 1305 has an orientation 1341 that is about parallel to the nearest crystal striation 1350. The orientation 1341 of a long side 1302 of at least one embossing 1300, 1305 may therefore be parallel to the orientation 1345 of at least a portion of a line 1340 of embossings. In a given line 1340 on the surface of the substrative layer 130, the long side 1302 of a first embossing 1300, 1305 may be parallel to the long side of at least a second adjacent but non-touching embossing 1300, 1305. More generally, embossings in a given line 1340, or a given set 1440, may have the same orientation 1341. FIG. 1D also presents at least one optional deeper embossing 1301 that is formed deeper into the substrative layer 130, for example with at least a portion that is below the reacted layer 1310 of the substrative layer, than other embossings 1300 on the same line 1340. Embossings manufactured on a CIGS substrative layer with the objective of forming uniformly distributed point contacts ordinarily have a length along direction 1341 ranging from about 5 nm to about 40 nm. A person skilled in the art of manufacturing devices comprising a CIGS absorber layer with a carrier lifetime of 1-100 ns will preferably choose to manufacture a high photovoltaic conversion efficiency device where embossings have a length comprised between about 5 nm and 20 nm, preferably about 10 nm with a distance between the centroid of a first embossing and the centroid of a nearest second embossing of about 35 nm to 65 nm, preferably about 50 nm.

Figure 1E:
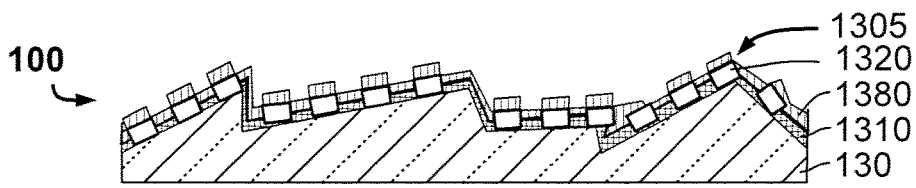

FIG. 1E presents the device of cross-section of FIG. 1B where a functional layer 1380 has been added to cover at least part of the surface of substrative layer 130. The coating may therefore also coat part of the reacted layer 1310 of substrative layer 130. The coating may also at least partly cover at least one, ordinarily a plurality, of embossings 1305 comprising alkali crystals 1320. The coating may preferably not entirely cover embossings 1305 so as to facilitate subsequent dissolving of alkali crystals 1320. The coating may preferably comprise material to constitute at least one functional layer. Types of functional layers may comprise so-called passivation layer, buffer layers, or conductive layers. Materials for a passivation layer may comprise oxides such as aluminum oxides, silicon oxides, nitrides such as silicon nitrides, or amorphous silicon. Materials for a buffer layer may comprise those listed for buffer layer 140. Materials for a conductive layer may comprise those listed for the transparent conductive front-contact layer 150, may comprise metals such as materials comprising silver, gold, platinum, copper, indium, aluminum, nickel, and/or may materials listed for electrically conductive layer 120.

Figure 1F:
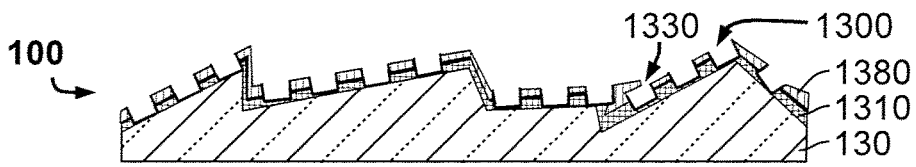

FIG. 1F presents the device of cross-section of FIG. 1E after removal of at least one alkali crystal 1320, preferably a plurality of alkali crystals. Removal of at least one alkali crystal ordinarily also results in removing part of the material of the functional layer 1380 that covers the alkali crystal. The removal of at least one alkali crystal results in forming at least one concave embossing 1300. The resulting device therefore comprises at least one region comprising at least one embossing into at least one functional layer 1380 that extends into at least the substrative layer 130. When viewed from a direction that is perpendicular to the surface of the region 135 where the embossing 1300 is formed, the contour of the embossing in the functional layer is ordinarily about the same as that in the underlying substrative layer. However, a device may also comprise at least one embossing that does not have the same contour in the functional layer as in the underlying substrative layer, thereby forming at least one partly closed embossing 1330. This may happen, for example, if upon forming the concave embossing 1300 the functional layer is sufficiently thick over the alkali crystal to remain attached to the rest of the substrative layer 130, functional layer 1380 into which the embossing is formed.

Figure 1G:
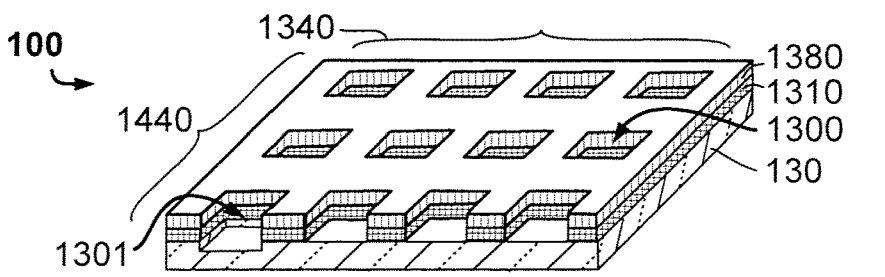

FIG. 1G is a perspective view of a region of the device presented in FIG. 1F. The device in this figure corresponds to that of FIG. 1D but represented in this figure with a functional layer 1380 that coats the substrative layer 130, its optional reacted layer 1310, and is similarly patterned with embossings 1300, 1301. The device therefore at least comprises features presented in FIG. 1D but here with the additional functional layer. The device comprises a plurality of lines 1340 of regularly spaced embossings 1300, 1301. The device may also comprise optional deeper embossings 1301. A region of the device may therefore comprise at least one set 1440 comprising a plurality of parallel lines 1340 of the embossings described in FIG. 1F.

Figure 1H:
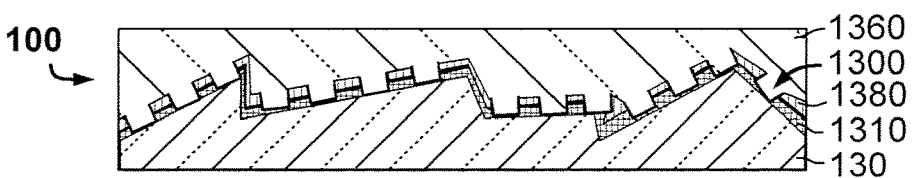

FIG. 1H presents a device 100 comparable to that of cross-section of FIG. 1F that additionally comprises at least one filler layer 1360 that coats at least one region of the device. Filler layer 1360 may for example have a composition or comprise materials that are similar to those of the buffer layer 140 or of the front-contact layer 150. Although FIG. 1H is illustrated with a functional layer 1380, said functional layer may be considered as optional. Material of the filler layer 1390 may at least partly fill at least one embossing 1300, 1301, preferably completely fill at least one embossing, more preferably fill a plurality of embossings. Embossings 1300, 1301 may comprise at least one electrically conductive pathway from substrative layer 130 to filler layer 1360.

Figure 1I:
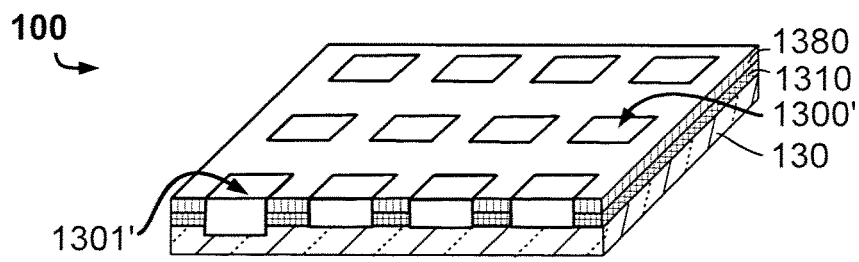

FIG. 1I presents a device 100 comparable to that of FIG. 1G. The device in this figure comprises embossings 1300', 1301' that are filled with filler material. For an optoelectronic device, the filler material may for example be material acting as buffer material. The filler material, which may fill at least one embossing in at least one of layers 130, reacted layer 1310, functional layer 1380, is preferably flush with the surface of at least one of layers 130, reacted layer 1310, or functional layer 1380.

Figure 1J:
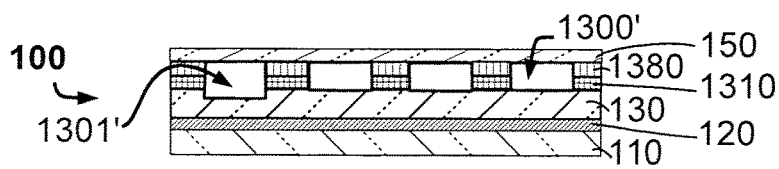

FIG. 1J presents a cross section of the device 100 of FIG. 1I after coating with a front-contact layer 150. At least one conductive layer 120 and a substrate 110 are also represented. Filled embossings 1300', 1301' therefore provide point contacts as electrical pathways from the absorber or substrative layer 130 to the front-contact layer 150.

FIG. 2 presents a method 200 comprising material deposition steps to manufacture said device 100, for example a TF optoelectronic or PV device, comprising a plurality of embossings forming nanopatterns. The method is considered to be especially appropriate for substrates considered alkali-nondiffusing or that may comprise at least one barrier layer that prevents the diffusion of alkali metals from the substrate into subsequently deposited coatings. The method as described is applicable to production on glass, metal, or various coated substrates, and is especially advantageous for polymer substrate materials such as polyimide.

An exemplary sequence of material layer deposition and treatment follows. The purpose of this description is to clarify the context within which forming of a plurality of self-assembled embossings, the main subject of this invention, occurs. The description also focuses on forming concave embossings, also called cavities. Between any of the subsequent manufacturing steps, a person skilled in the art will know how to, as an option, temporarily store the unfinished product, for example within a vacuum or near vacuum container or even within a container characterized by a controlled atmospheric environment or possibly a container comprising at least one inert gas. Exposure to air and/or to humidity is known to have an effect on the chemical composition of the material layers deposited during the material deposition steps. A person skilled in the art will advantageously use steps of the method within a manufacturing sequence where exposure to air and/or humidity is kept to a minimum between steps. A person skilled in the art may also use steps of the method so that the intermediate product is only exposed to a controlled environment between steps, such as vacuum, near vacuum, low humidity atmosphere, or at least one inert gas. In case of exposure to air between steps that is different from air at standard ambient temperature and pressure (SATP) and 40% relative humidity (RH), a person skilled in the art will adapt the limits for said cumulated minutes in air according to changes in aforementioned environmental parameters. In the rest of this document, the word minutes is abbreviated as min.

The method starts at step 210 by providing a substrate. Said substrate is an alkali-nondiffusing substrate.

Following step 210 and prior to the step of forming cavities 236, adding of at least one alkali metal 235 occurs as at least one event during and/or between any of the steps comprised in the interval from the step 210 of providing substrate (excluding the step 210 itself), to the step of controlling temperature 2300 (excluding the step 2300 itself). Said at least one said alkali metal comprises Cs and/or Rb. The fact that the adding may occur during or between said interval of steps is represented by dashed arrows emanating from block 235 in FIG. 2. Each of said alkali metals may be added simultaneously with any of the other of said alkali metals and/or during separate adding events. Adding of each of said alkali metals may comprise any or a combination of adding a layer or precursor layer of at least one of the alkali metals, co-adding at least one of the alkali metals with the forming of any of the method's material layers, or diffusing at least one of the alkali metals from at least one layer into at least one other material layer. Preferably, adding of at least one different alkali metal is done in the presence of at least one said C element. More preferably, adding of at least one different alkali metal may be simultaneous to adding at least one said C element. C elements comprise elements in group 16 of the periodic table including S, Se, or Te. More preferably, adding of Cs and/or Rb, for example by adding via a so-called Cs and/or Rb-comprising precursor such as Cs and/or RbF, Cs and/or RbCl, Cs and/or RbBr, Cs and/or RbI, Cs and/or Rb2S, Cs and/or Rb2Se, is done in the presence of at least one said C element.

At step 220, forming at least one back-contact layer comprises depositing at least one electrically conductive layer. Forming of the back-contact layer may be done using a process such as sputtering, spraying, sintering, electrodeposition, CVD, PVD, electron beam evaporation, or spraying of the materials listed in the description of said electrically conductive layer 120.

The providing layer step 230 may for example comprise forming at least one substrative layer. For example, for forming an optoelectronic device, the providing layer step may comprise coating said electrically conductive layer with at least one absorber or substrative layer 130. Said substrative layer may for example be an ABC substrative layer 130. The materials used correspond to those in the description provided for an ABC substrative layer 130. Said substrative or absorber layer may be deposited using a variety of techniques such as sputtering, spraying, sintering, CVD, electrodeposition, printing, or as a preferred technique for an ABC material, physical vapor deposition. Substrate temperatures during absorber layer deposition are ordinarily comprised between 100° C. and 650° C. The range of temperatures and temperature change profiles depend on several parameters including at least the substrate's material properties, the supply rates of the materials that compose the ABC material, and the type of coating process. For example, for a vapor deposition process, substrate temperatures during forming of the absorber layer will ordinarily be below 600° C., and if using substrates requiring lower temperatures, such as a polyimide substrate, preferably below 500° C., and more preferably in the range from 100° C. to 500° C. For a co-evaporation vapor deposition process, substrate temperatures during forming of the absorber layer will ordinarily be in the range from 100° C. to 500° C. Said substrate temperatures may be advantageously used with a polyimide substrate.

The substrative layer may also be coated with other layers such as at least one layer that may function as a buffer layer, an indium selenide layer, and/or a gallium selenide layer.

For a deposition process such as physical vapor deposition, for example if providing layer step 230 is done using a physical vapor deposition process, adding of Cs and/or Rb as part of adding at least one alkali metal 235 may be done during and/or in continuation of the physical vapor deposition process by supplying Cs and/or Rb fluoride, Cs and/or RbF. This may, for example, be advantageous when manufacturing with a co-evaporation physical vapor deposition system. Adding the alkali metal Cs and/or Rb will preferably be done in the presence of a flux of element Se supplied at a rate in the range of 5 to 100 Å/s, preferably at a rate in the range of 20 to 50 Å/s.

At step 2300, controlling temperature during or after the step of adding at least one alkali metal 235 comprising Cs and/or Rb enables the forming and self-assembly of embossings onto substrative layer 130. A person skilled in the art may control manufacturing parameters such as i) the evolution of temperatures during and after adding at least one alkali metal including Cs and/or Rb, ii) the order in which a plurality of alkali metals via a plurality of steps of adding at least one alkali metals is done, and iii) the amount of the at least one alkali metal supplied during the adding at least one alkali metal. Control of manufacturing parameters enables control of at least the average length, area, aggregation of embossings, and over the layer's surface, the density, the separation, the covered area, the lining up, and the pattern forming of embossings.

Substrate temperature ranges for the step of controlling temperature or for said adding of at least one alkali metal comprising Rb and/or Cs are from 100° C. to 700° C., preferably from 200° C. to 450° C., more preferably from 300° C. to 400° C. For better results, the step of controlling temperature comprises controlling the temperature between a range from about 250° C. to about 380° C., preferably between a range from about 300° C. to about 370° C. A person skilled in the art will select appropriate temperatures for said adding of at least one alkali metal so that they are compatible with the materials deposited, TF properties, and substrate. For example, adding of at least one alkali metal may be with a physical vapor deposition process where an alkali metal precursor comprising Cs and/or Rb for example in the form of CsF and/or RbF, is supplied at a rate equivalent to an effective layer deposition of about 1 nm/min to 2 nm/min for a duration of 20 minutes. The skilled person will also know that adding of at least one alkali metal comprising Cs and/or Rb may take place with adding of one or more of said at least one alkali metal at substrate temperatures ordinarily lower than 700° C. and possibly much lower than 350° C., such as at ambient temperatures of about 25° C. and below. The substrate may then be heated afterwards, thereby facilitating diffusing of said alkali metals to the TF layers of the optoelectronic device, possibly in combination with depositing at least one C element. Adding at least one alkali metal 235 is preferably done in the presence of Se.

The amount of Cs and/or Rb added by adding at least one alkali metal 235 is such that following forming of front-contact layer 150 at later step 250, said amount comprised in the interval of layers 370 from back-contact layer 120, exclusive, to front-contact layer 150, inclusive, is in the range between 200 and 10000 Cs and/or Rb atoms per million atoms and the amount of other alkali metals is in the range of 5 to 10000 ppm and at most 3/2 preferably 1/2 and at least 1/2000 of the comprised amount of Cs and/or RbCs and/or Rb. A TF PV device that has a superior PV conversion efficiency preferably has an amount comprised in said interval of layers 370 from about 500 to 2000 Cs and/or Rb atoms per million atoms.

A person skilled in the art may advantageously use the step of controlling temperature 2300 in accordance with the step of adding at least one alkali metal 235 comprising Cs and/or Rb. For example, one may form a high density of embossings on a layer surface by, in the step of adding at least one alkali metal 235, adding Na before adding Cs and or Rb. The resulting embossings ordinarily have a length that is comprised between about 10 nm and 100 nm, preferably about 20 nm. However, the greater the amount of Cs and/or Rb, the more alkali crystals are formed. The more alkali crystals are formed, the greater the probability of forming crystal aggregates and/or forming embossings that contact each other on the layer surface, thereby forming larger aggregate embossings. A person skilled in the art may therefore control the average area or size of embossings as a function of the amount of Cs and/or Rb added in the step of adding at least one alkali metal 235.

As a guiding principle for the skilled person applying the method to manufacture photovoltaic devices with a higher photovoltaic efficiency, an objective for raising efficiency is to try raise open circuit voltage VOC by trying to manufacture concave embossings that have the smallest possible size or length. However, another objective is to maximize the device's fill factor (FF) and therefore determine the optimal distance between the centroid of a first embossing and the centroid of a nearest second embossing. Optimization of this distance is a function of the electrical resistance between the absorber layer and at least one subsequently deposited layer, for example a buffer layer, possibly also a front-contact layer.

At step 2350, that of forming a functional layer, a functional material may optionally be deposited to form a functional layer 1380. The material may for example confer a buffer function between the substrative or absorber layer and a subsequently deposited front-contact layer. If the objective is to subsequently form concave embossings 1300, the functional layer is preferably sufficiently thin so as to enable the optional subsequent step of forming cavities 236. Therefore, at least a portion of the alkali crystals 1320 that forms at least one embossing 1305 should preferably remain exposed, that is, preferably not coated by material of functional layer 1380 so as to enable processing at subsequent step 236. Materials that may be used for forming functional layer 1380 comprise those listed in the description for FIG. 1E. Methods that may be used for forming the functional layer comprise CVD, PVD, sputtering, sintering, electrodeposition, printing, atomic layer deposition, or as a well known technique at atmospheric pressure, CBD.

At step 236, that of forming cavities, at least the surface of substrative layer or absorber layer 130 is subject to at least one of the steps of aqueous wetting 237, treating layer surface 238, or forming buffer layer 240. At step 236 at least one, preferably a plurality, of alkali crystals embedded within the surface of the substrative layer is dissolved. Part of the substrative layer material directly underlying at least one of said alkali crystal comprising Cs and/or Rb may also be dissolved, said part will ordinarily not extend deeper into the substrative than one height unit corresponding to the depth of the crystal embedded into the substrative layer. Also, part of the surface of the substrative layer directly in contact with said alkali crystals may be dissolved. Furthermore, part of the surface of the substrative layer may also be dissolved.

At optional step 237, represented as a dashed box because the step may be considered optional, aqueous wetting comprises wetting at least the surface of substrative layer 130 with at least one aqueous wetting material or solution. Aqueous wetting will preferably be done in a bath. Aqueous wetting may also be done using spraying. Aqueous wetting is preferably with a diluted aqueous ammonia solution. Exposure to air is known to have an effect on the chemical composition of the substrative layer. A person skilled in the art will try to minimize the duration of exposure of the device to air. Although the duration of exposure may be of several days, aqueous wetting preferably occurs after the substrate has spent a duration of at most 10, more preferably less than 5, cumulated minutes in air at SATP and 40% RH after completion of the providing layer step 230. Described briefly, composition of the preferred diluted aqueous ammonia solution bath is an aqueous solution with a molarity in the range from 3 M to 5 M. Said diluted aqueous ammonia solution comprises a mixture of water and commercially available ammonia aqueous solution. Parameters relevant to the aqueous wetting step comprising a bath comprise a cumulated duration of about 10 min, preferably, about 2 min, a bath temperature of about 25° C. and a molarity of about 3 mol/L (also written M). Ranges, preferred ranges, and most preferred ranges for said parameters are presented in Table 1 below. Most preferred ranges are at least applicable using a bath. A person skilled in the art will readily adapt parameters to other types of wetting apparatuses.

Wetting steps may take place in a chemical bath deposition (CBD) apparatus and/or a spraying apparatus. A chemical bath deposition system ensures continuous flow and mixing of the bathing solution over at least substrative layer 130.

At the steps for treating layer surface 238 and/or forming buffer layer 240, so-called "oxidation state +1" and/or so-called "oxidation state +2" elements, thereafter abbreviated +1/+2 elements, are added to the substrative layer 130 and especially to the surface of the substrative layer. For a substrative layer that comprises an absorber layer, adding of oxidation state +1/+2 elements to the surface of the substrative layer transforms at least a portion of the surface from a p-type absorber surface into an n-type absorber surface, thereby forming a buried junction in at least a portion of the absorber layer. Said buried junction may be a homojunction. Said buried junction is preferably a p-n junction. Resulting presence of oxidation state +1/+2 elements into the absorber layer may then, for example, be the result of physisorption, chemisorption, or diffusion. Said oxidation state +1/+2 elements comprise at least one element of at least one of group 2, group 3, lanthanide series, actinide series, or transition metals from the periodic table of elements. A commonly used oxidation state +1/+2 element is cadmium. Although this description focuses mostly on solutions comprising cadmium, a person skilled in the art may adapt the invention to use steps that comprise other or additional oxidation state +1/+2 elements. For example, a person skilled in the art may want to reduce or eliminate the amount of cadmium comprised in the resulting PV device by replacing part or all of the cadmium used in the method with at least one other oxidation state +1/+2 element.

At step 238, represented as a dashed box because the step may be considered optional, at least substrative layer 130 is subject to at least one treating layer surface 238. The step of treating layer surface 238 is especially useful if the step of forming buffer layer 240 is omitted. The duration of exposure to air between aqueous wetting 237 and treating layer surface 238 is preferably at most 2, preferably less than 0.5, cumulated minutes in air at aforementioned SATP and RH of step 237. Described briefly, relevant parameters for the step of treating the layer surface comprise treating for a cumulated duration of about 22 minutes at least substrative layer 130 into a solution with temperature of about 70° C. comprising, per liter of water, an amount of about 60 mL of cadmium (Cd) solution and an amount of about 140 mL of ammonia ($NH_3$) solution. Ranges for said parameters are presented in Table 1. Said water is preferably distilled water or deionized water, more preferably ultra-pure water with a resistivity of about 18 MΩ·cm. Said cadmium solution comprises a Cd salt solution with a molarity most preferably in the range from about 0.026 to 0.03 mol/L. Concentration of said ammonia solution is more preferably in the range from 14.3 to 14.7 M. Ranges, preferred ranges, and most preferred ranges for said parameters are presented in Table 1. Most preferred ranges are at least applicable using a bathing apparatus.

TABLE 1

| Ranges for steps 237 to 246. | | | |
|---|---|---|---|
| | Range from-to | Pref. range from-to | More pref. range from-to |
| Step 237: Aqueous wetting | | | |
| Duration [min] | 0.05-7200 | 0.1-30 | 1-5 |
| Temperature [° C.] | 2-95 | 10-50 | 23-27 |
| Diluted ammonia molarity [mol/L] | 0-20 | 1-10 | 2-4 |
| Step 238: Treating layer surface | | | |
| Duration [min] | 0.05-7200 | 0.1-30 | 20-24 |
| Temperature [° C.] | 2-95 | 10-85 | 65-75 |
| Amount of Cd solution per liter [mL] | 10-1000 | 20-100 | 55-65 |
| Amount of $NH_3$ solution per liter [mL] | 0-990 | 20-400 | 130-150 |
| Cd molarity in Cd solution [mol/L] | 0.00001-10 | 0.01-0.1 | 0.026-0.03 |
| Ammonia solution molarity [mol/L] | 1-30 | 10-20 | 14.3-14.7 |
| Step 240: Forming buffer layer | | | |
| Duration [min] | 0.05-7200 | 0.1-30 | 14-18 |
| Temperature [° C.] | 2-95 | 10-85 | 65-75 |
| Cd salt solution molarity [mol/L] | 0.00001-10 | 0.01-0.1 | 0.026-0.030 |
| Ammonia solution molarity [mol/L] | 1-30 | 10-20 | 14.3-14.7 |
| Thiourea aq. sol. molarity [mol/L] | .01-10 | 0.2-0.6 | 0.35-0.4 |
| Step 244: Annealing | | | |
| Cadmium sulfide, temperature [° C.] | 100-300 | 150-200 | 175-185 |
| Cadmium sulfide, duration [min] | 1-30 | 1-5 | 1.8-2.2 |
| Zinc oxi-sulfide, temperature [° C.] | 100-300 | 150-250 | 190-210 |
| Zinc oxi-sulfide, duration [min] | 1-30 | 5-15 | 9-11 |
| Step 246: Degassing | | | |
| Degassing temperature [° C.] | 10-150 | 20-60 | 28-32 |
| Degassing duration [min] | 0.1-3000 | 1440-2880 | 1800-2400 |

At optional step 240, represented as a dashed box because the step may be considered optional, forming the buffer layer comprises coating said substrative layer with at least one so-called semiconductive buffer layer 140. The materials used correspond to those in the description provided for buffer layer 140. Said buffer layer may be deposited using a variety of techniques such as CVD, PVD, sputtering, sintering, electrodeposition, printing, atomic layer deposition, or as a well known technique at atmospheric pressure, chemical bath deposition (CBD). To form a cadmium sulfide buffer layer, a person skilled in the art may form at least one buffer layer bath for CBD comprising a Cd salt aqueous solution of about 0.028 M concentration and an ammonia solution of about 14.5 M concentration that are first mixed together with water, preferably high-purity water (18 MΩ·cm), in a volume ratio of about 3:7:37, preheated to about 70° C. for about 2 min, and then supplemented with a thiourea aqueous solution of about 0.374 M concentration. At least substrative layer 130 is then immersed within said buffer layer bath that is maintained to a temperature of about 70° C. until the desired buffer layer thickness is obtained. At least substrative layer 130 is then washed with water, preferably high-purity water.

Following at least one step of forming cavities 236, a person skilled in the art will notice, for example using TF analysis techniques such as X-ray photoelectron spectrometry (XPS) or secondary ion mass spectrometry (SIMS), that the surface of the substrative, or absorber, layer comprises more oxidation state +1/+2 elements than the surface of absorber layers manufactured according to prior art or, for an analysis using inductively coupled plasma mass spectrometry (ICP-MS), that the concentration of the +1/+2 elements in the absorber layer is higher than in absorber layers manufactured according to prior art.

For example, for devices where the oxidation state +1/+2 element(s) added at the step of forming cavities 236 is cadmium, an ICP-MS analysis of the resulting device after forming cavities is summarized in Table 2. Here, adding at least one alkali metal 235 is provided by evaporating material comprising Cs and/or Rb fluoride (Cs and/or RbF) to add Cs and/or Rb to the substrative layer 130. Three devices are compared: a first device where no Cs and/or Rb is added, a second, best mode device, subjected to about 20 minutes of evaporation, and a third device subjected to about 60 minutes of evaporation. The evaporation rates are those mentioned previously. Evaporation flux rates and corresponding evaporation durations will be adapted by the person skilled in the art. A person skilled in the art may therefore advantageously use a manufacturing method where adjusting the amount of adding at least one alkali metal 235, or for a more specific example, adding Cs and/or Rb, contributes to regulating the amount of oxidation state +1/+2 elements that are added to or absorbed by the absorber layer. Said method of adding at least one alkali metal 235 may also contribute to adjusting the duration of the step of forming cavities 236 or steps therein of aqueous wetting 237, treating of layer surface 238, forming buffer layer 240.

TABLE 2

Effect on cadmium concentration from post-deposition adding of Cs and/or RbCs and/or Rb

| Cadmium concentration (atomic percentage) | Range from-to | Pref, range from-to |
| --- | --- | --- |
| Device with no added Cs and/or Rb | 0.02-0.1 | 0.05-0.4 |
| Dev. with 20 min. added Cs and/or Rb | 0.05-2 | 0.2-1 |
| Dev. with 60 min. added Cs and/or Rb | 0.1-4 | 0.5-2 |

Steps 238 and/or 240 are preferably done in at least one bathing apparatus. However, a person skilled in the art will readily adapt the method for use with a spraying apparatus. It is also possible to use physical vapor deposition (PVD) apparatuses and a plurality of associated deposition methods, the most common being evaporative deposition or sputter deposition. A person skilled in the art will readily manufacture a set of devices covering a range of parameters, for example a range of durations for at least one of steps 237, 238, 240, 244, 246, so as to obtain a photovoltaic device where, for example, photovoltaic efficiency is maximized. Other objectives may be, for example, to minimize buffer layer thickness, maximize efficiency to buffer layer thickness ratio, or maximize efficiency to cadmium content ratio.

At optional step 242 at least substrative layer 130 is subject to at least one short drying step. The short drying step may be done in air, but preferably is done using a blown inert gas, more preferably using at least one ionization blow off nozzle, even more preferably with the blown inert gas being nitrogen.

At optional step 244 at least substrative layer 130 is subject to at least one annealing step. For a cadmium sulfide buffer layer, said annealing step is preferably done at about 180° C., preferably in air for about 2 min. For a zinc oxi-sulfide buffer layer, said annealing step is preferably done at about 200° C., preferably in air for about 10 min.

At optional step 246, at least substrative layer 130 is subject to at least one degassing step. This step is ordinarily not needed for devices where the substrate does not absorb humidity, for example glass or metal substrates. Said degassing is preferably done in vacuum. The degassing step is preferred for substrate materials, for example polyimide, that may have absorbed humidity at previous manufacturing steps. For example, for a degassing temperature of about 25° C., an effective degassing duration is about 35 hours.

Parameter ranges for steps 237 to 246 are provided in Table 2. To tune the optional process of forming the buffer layer of step 240, one skilled in the art will ordinarily develop a test suite over a range of buffer coating process durations to manufacture a range of PV devices comprising a range of buffer layer thicknesses. One will then select the buffer coating process duration that results in highest PV device efficiency.

The following steps describe how to complete the manufacture of a working PV device benefiting of the invention.

At step 250, forming filler layer comprises coating the device with at least one filler layer 1360. Said filler layer may for example have a composition or comprise materials that are similar to those of the buffer layer 140 or of the front-contact layer 150. Forming the filler layer may for example preferably favor filling the concave embossings 1300, 1301, so that the process preferably deposits buffer material into the cavities. The buffer material may be deposited according to the description for step 240 of forming buffer layer. The resulting device therefore comprises at least one cavity, preferably a plurality of cavities, that are filled with buffer material. The person skilled in the art may complement this step with a washing and/or a drying step. The resulting device may subsequently be coated with at least one transparent conductive front-contact layer 150. Said front-contact layer ordinarily comprises a transparent conductive oxide (TCO) layer, for example made of doped or non-doped variations of materials such as indium oxide, gallium oxide, tin oxide, or zinc oxide that may be coated using a variety of techniques such as PVD, CVD, sputtering, spraying, CBD, electrodeposition, or atomic layer deposition.

At optional step 260, forming front-contact grid comprises depositing front-contact metallized grid traces 160 onto part of transparent conductive front-contact layer 150. Also optionally, said TF PV device may be coated with at least one anti-reflective coating such as a thin material layer or an encapsulating film.

The steps may also comprise operations to delineate cell or module components. Delineation ordinarily comprises cutting grooves into back-contact layer 120 to provide electrically separate back-contact components. A second delineation step comprises cutting grooves, segments, or holes into at least substrative layer 130. The second delineation step may also comprise cutting into at least one of front-contact layer 150, buffer layer 140, or back-contact layer 120. A third delineation step comprises cutting grooves into at least front-contact layer 150. The second and third delineation step may be made simultaneously. Delineation, also called patterning, is preferably done using at least one laser.

The invention claimed is:

1. A method for fabricating patterns on a surface of a device, comprising:
    exposing the surface of the device to at least one alkali metal, wherein the at least one alkali metal comprises Cs or Rb, and the device comprises at least one layer; and
    controlling a temperature of the surface to form a plurality of embossings at the surface, wherein at least a portion of the plurality of embossings result from a self-assembly process that comprises:
        forming of a plurality of alkali crystal compounds including compounds of Cs or Rb and a material of the at least one layer of the device,
        wherein the alkali crystal compounds are embedded into the surface of the at least one layer of the device, and form at least a first line of the embossings that are regularly spaced, and that are adjacent and parallel to at least one second line of regularly spaced embossings within at least one region of the at least one layer.

2. The method of claim 1, further comprising exposing the surface of the device to an additional alkali metal comprising K or Na.

3. The method of claim 1, wherein the exposing the surface of the device to the at least one alkali metal further comprises adding at least one additional element comprising S, Se, or Te.

4. The method of claim 1, wherein the at least one layer comprises an ABC chalcogenide material, wherein A comprises Cu or Ag, B comprises In, Ga, or Al, and C comprises S, Se, or Te.

5. The method of claim 1, wherein the at least one layer comprises Cu(In,Ga)Se2.

6. The method of claim 1, wherein controlling the temperature of the at least one layer comprises controlling the temperature in a range from about 250° C. to about 380° C.

7. The method of claim 1, further comprising coating at least a portion of the at least one layer with a functional layer.

8. The method of claim 7, wherein at least one of the embossings is formed at the surface of the at least one layer and a surface of the functional layer.

9. The method of claim 1, wherein the at least one layer of the device is disposed on a surface of a substrate that extends between a delivery roll and a take-up roll of a roll-to-roll manufacturing apparatus.

10. The method of claim 1, wherein a long axis of at least one embossing in the first line of the embossings is collinear or approximately collinear with at least the first line.

11. The method of claim 1, wherein the at least the first line of the embossings is embossed along at least one crystal striation of at least one region of the surface of the at least one layer.

12. The method in claim 1, wherein the at least one region is on a surface of a crystal at the surface of the at least one layer.

13. The method of claim 1, wherein the at least one layer comprises a reacted layer.

14. The method of claim 1, wherein the device is a thin-film optoelectronic device that is formed on a flexible substrate.

15. A method for fabricating patterns on a surface of a device, comprising:
    exposing the surface of the device to at least one alkali metal, wherein the at least one alkali metal comprises Cs or Rb, and the device comprises at least one layer; and
    controlling a temperature of the surface to form a plurality of embossings at the surface, wherein at least a portion of the plurality of embossings result from a self-assembly process that comprises:
        forming of a plurality of alkali crystal compounds including compounds of Cs or Rb and a material of the at least one layer of the device,
        wherein the alkali crystal compounds are embedded into the surface of the at least one layer of the device, and form at least a first line of the embossings that are regularly spaced, and that are adjacent and parallel to at least one second line of regularly spaced embossings within at least one region of the at least one layer; and
    forming at least one cavity by dissolving at least a portion of the alkali crystal compound, wherein the method of forming the at least one cavity comprises:
        forming at least one buffer layer on the surface of the at least one layer;
        exposing the surface of the at least one layer to one or more oxidation state +1/+2 elements;
        aqueous wetting of the surface of the at least one layer with a solution comprising water; and
        aqueous wetting of the surface of the at least one layer with a diluted aqueous ammonia solution with a diluted ammonia molarity in a range from 0 to 20 M.

16. The method of claim 15, wherein at least one embossing has a shape of at least one cavity in the at least one layer.

17. The method of claim 15, further comprising a step of filling at least a portion of the at least one cavity by forming a filler layer within the at least one cavity.

18. The method of claim 17, wherein at least one embossing comprises an electrical point contact between the surface of at least one layer and the filler layer, and at least some material of which is comprised within the at least one embossing.

19. A method for fabricating patterns on a surface of a device, comprising:
    exposing the surface of the device to at least one alkali metal, wherein the at least one alkali metal comprises Cs or Rb, and the device comprises at least one layer;
    forming at least one back-contact layer;
    providing at least one substrative layer comprising an absorber layer; and
    controlling a temperature of the surface to form a plurality of embossings at the surface, wherein at least a portion of the plurality of embossings result from a self-assembly process that comprises:
        forming of a plurality of alkali crystal compounds including compounds of Cs or Rb and a material of the at least one layer of the device,
        wherein the alkali crystal compounds are embedded into the surface of the at least one layer of the device, and form at least a first line of the embossings that are regularly spaced, and that are adjacent and parallel to at least one second line of regularly spaced embossings within at least one region of the at least one layer.

20. The method of claim 19, further comprising drying the absorber layer.

* * * * *